United States Patent
Kim

(10) Patent No.: US 9,375,752 B2
(45) Date of Patent: Jun. 28, 2016

(54) MASK FOR DEPOSITING A THIN FILM AND A THIN FILM DEPOSITION METHOD USING THE SAME

(71) Applicant: SAMSUNG DISPLAY CO., LTD., Yongin, Gyeonggi-Do (KR)

(72) Inventor: Woong-Sik Kim, Gyeonggi-Do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 22 days.

(21) Appl. No.: 14/151,211

(22) Filed: Jan. 9, 2014

(65) Prior Publication Data

US 2014/0370196 A1 Dec. 18, 2014

(30) Foreign Application Priority Data

Jun. 14, 2013 (KR) .................. 10-2013-0068637

(51) Int. Cl.
*C23C 14/04* (2006.01)
*B05D 1/32* (2006.01)
*B05B 15/04* (2006.01)

(52) U.S. Cl.
CPC .............. *B05D 1/32* (2013.01); *B05B 15/0481* (2013.01); *C23C 14/042* (2013.01)

(58) Field of Classification Search
CPC ..... B05B 15/0481; B05D 1/32; C23C 14/042
See application file for complete search history.

(56) References Cited

U.S. PATENT DOCUMENTS

| 3,323,490 A * | 6/1967 | McGilliard .................... 118/504 |
| 5,742,422 A * | 4/1998 | Drake ........................... 359/227 |
| 2003/0085115 A1* | 5/2003 | Tani et al. ................. 204/192.13 |
| 2013/0112139 A1* | 5/2013 | Pei ...................... B05B 15/0456 118/504 |

FOREIGN PATENT DOCUMENTS

| KR | 1020010066286 | 7/2001 |
| KR | 1020100095191 | 8/2010 |
| KR | 1020120007573 | 1/2012 |
| KR | 1020120036108 | 4/2012 |

* cited by examiner

*Primary Examiner* — Dah-Wei D Yuan
*Assistant Examiner* — Stephen Kitt
(74) *Attorney, Agent, or Firm* — F. Chau & Associates, LLC

(57) ABSTRACT

A mask for depositing a thin film and a thin film deposition method using the same are disclosed. The mask includes pattern bars disposed on a frame. The pattern bars are moveable and are position to form a deposition pattern. The mask includes a pattern modification mechanism configured to move the pattern pars to a plurality of positions to modify the deposition pattern.

10 Claims, 6 Drawing Sheets

MASK FOR DEPOSITING A THIN FILM AND A THIN FILM DEPOSITION METHOD USING THE SAME

CROSS-REFERENCE TO RELATED PATENT APPLICATION

This application claims priority under 35 U.S.C. §119 to Korean Patent Application No. 10-2013-0068637, filed in the Korean Intellectual Property Office on Jun. 14, 2013, the disclosure of which is incorporated by reference herein in its entirety.

TECHNICAL FIELD

The present invention relates to a mask for depositing a thin film and a thin film deposition method using the same and more particularly, to a mask capable of modifying a deposition pattern and a thin film deposition method using the same.

DISCUSSION OF RELATED ART

Organic light-emitting display apparatuses have wide viewing angles, high contrast ratios, and fast response times, for example.

An organic light-emitting display apparatus generates colors by recombining electrons and holes injected from an anode and a cathode in a light-emitting layer to emit light. An organic light-emitting display apparatus has an emission layer disposed between the anode and the cathode. However, high light-emission efficiency may not be achieved with this configuration. Thus, intermediate layers, including an electron injection layer, an electron transport layer, a hole transport layer, and a hole injection layer, may be selectively added and inserted between each of the electrodes (e.g., anode and cathode) and the emission layer.

The electrodes and the intermediate layers, including the emissive layer, may be formed using various methods. One of these methods is a deposition method. To manufacture organic light-emitting display apparatuses by using the deposition method, a mask having the same pattern as that of a thin film to be formed may be aligned on a substrate, and then a raw material of the thin film may be deposited to form the thin film having the desired pattern.

Since organic light-emitting display apparatuses having various standards are developed, a mask for a respective standard is used. However, an existing mask may be fixed in shape and thus may only correspond to one pattern. Thus, if a product standard is changed, the mask may have to be replaced with a mask corresponding to the changed product standard.

As a result, productivity associated with the manufacture of organic light-emitting devices may be reduced and manufacturing costs may be increased.

SUMMARY

Exemplary embodiments of the present invention provide a mask corresponding to various patterns and a thin film deposition method using the same.

An exemplary embodiment of the present invention provides a mask for depositing a thin film. The mask includes a frame. The mask includes pattern bars disposed on the frame to form a deposition pattern. The mask includes a pattern modification mechanism, which moves the pattern bars to modify the deposition pattern.

The pattern modification mechanism may include a rotational support part. The rotational support part may be positioned in the frame. The rotational support part may be coupled to the pattern bars. The pattern modification mechanism may include an actuator. The actuator may rotate each of the pattern bars coupled to the rotational support part to an angle.

The actuator may include a micro electromechanical system (MEMS).

The pattern bars may include first pattern bars disposed on the frame in a first direction. The pattern bars may include second pattern bars disposed on the frame in a second direction. The second direction may be perpendicular to the first direction.

A portion between the pattern bars for forming the deposition pattern may have a square shape.

The pattern modification mechanism may include a sliding support part. The sliding support part may be positioned in the frame. The sliding support part may be coupled to the pattern bars. The pattern modification mechanism may include an actuator, which slides each of the pattern bars coupled to the sliding support part to a position.

The actuator may include a micro electromechanical system (MEMS)

The pattern bars may include first pattern bars disposed on the frame in a first direction. The pattern bars may include second pattern bars disposed on the frame in a second direction. The second direction may be perpendicular to the first direction. The actuator may drive at least one of the first and second pattern bars.

According to an exemplary embodiment of the present invention, there is provided a method of depositing a thin film. The method includes preparing a mask in which pattern bars for forming a deposition pattern are arranged in a frame. The method includes moving the pattern bars to modify the deposition pattern, and performing a deposition process using the modified deposition pattern of the mask.

The pattern bars may be rotated at a plurality of angles to modify the deposition pattern.

The pattern bars may be slid into a plurality of positions to modify the deposition pattern.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Exemplary embodiments of the present invention will be described below in more detail with reference to the accompanying drawings. However, the present invention may be modified in various different ways and should not be construed as limited to the embodiments disclosed herein.

Figure 1:
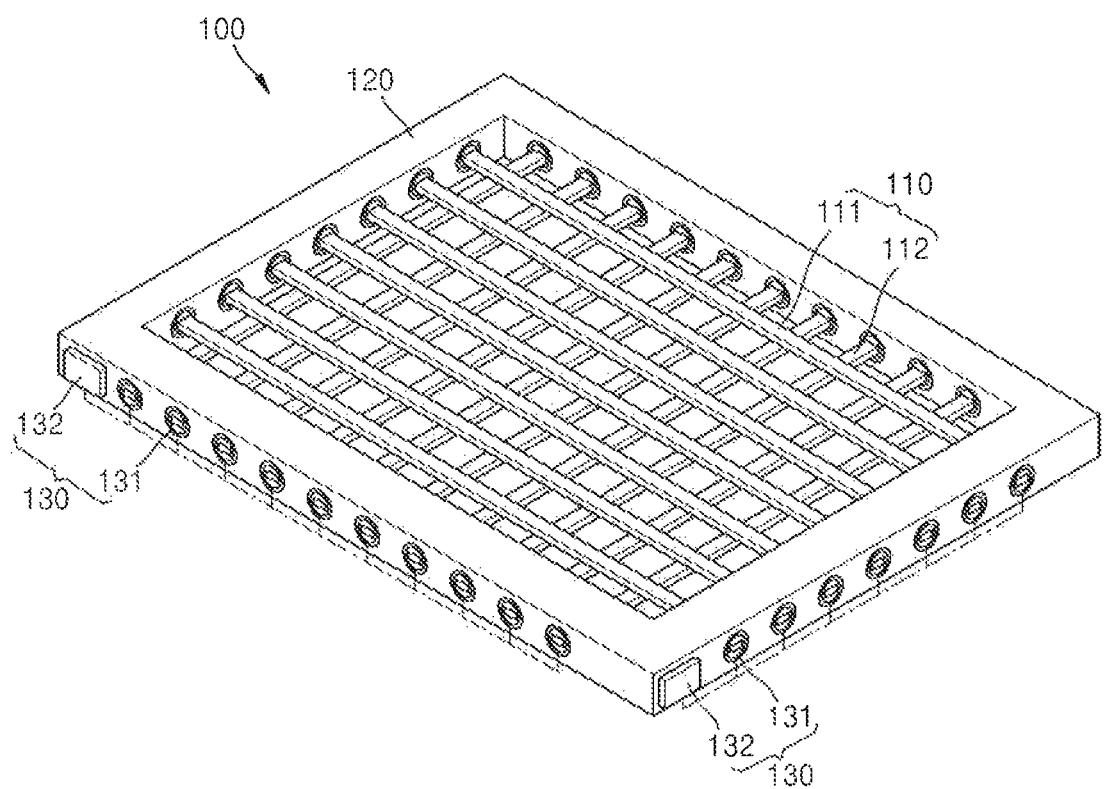
FIG. 1 is a perspective view of a mask according to an exemplary embodiment of the present invention.
Figure 2:
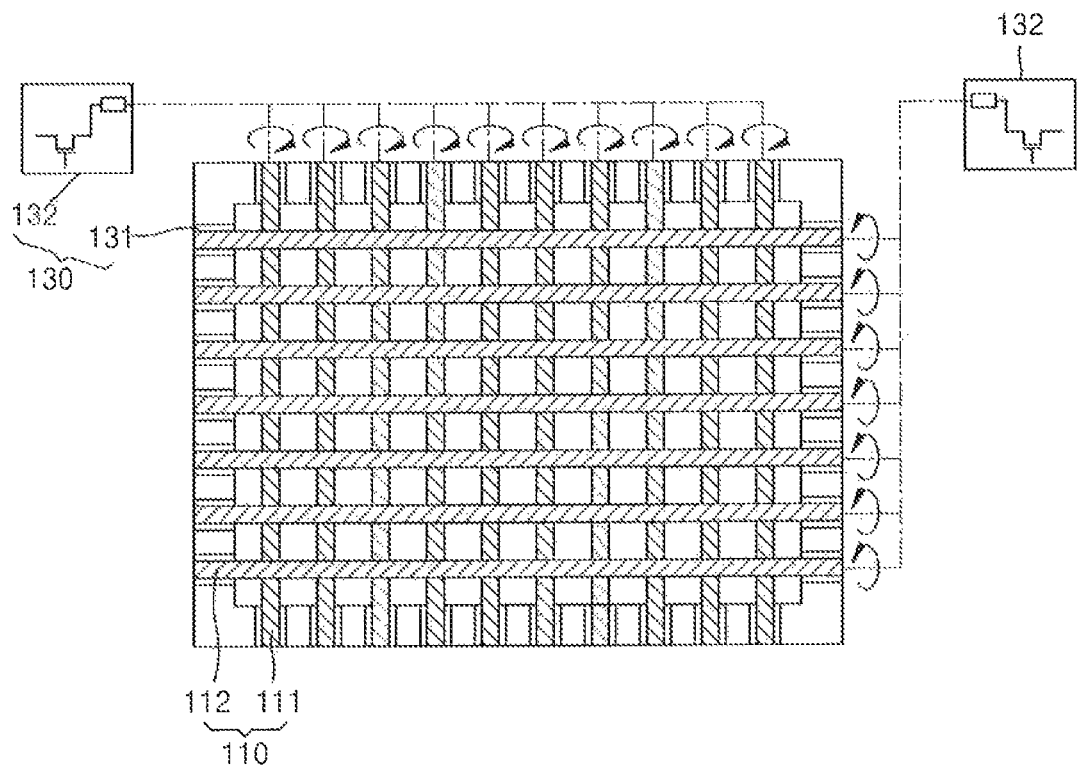
FIG. 2 is a plan view illustrating an exemplary embodiment of the mask of FIG. 1.

FIG. 1 is a perspective view of a mask 100 for depositing a thin film, according to an exemplary embodiment the present invention, and FIG. 2 is a plan view of the mask 100.

Referring to FIGS. 1 and 2, the mask 100 includes a frame 120, and a plurality of pattern bars 110. Each end of the pattern bars 110 may be fixed to the frame 120.

The frame 120 may define an outer frame of the mask 100. The frame 120 may have a square or rectangular shape in which an opening is defined in a center thereof. Both ends of each of the pattern bars 110 are supported by facing sides of the frame 120. The frame 120 and pattern bars 110 form deposition patterns of the mask 100. The pattern bars 110 include first pattern bars 111 disposed in a first direction, and second pattern bars 112 disposed in a second direction. The second direction may be perpendicular to the first direction. The first pattern bars 111 and second pattern bars 112 cross each other to form a deposition pattern having a grid shape.

The pattern bars 110, including the first and second pattern bars 111 and 112, are not fixed to the frame 120. For example, the pattern bars 110 may be rotated at a plurality of desired angles by a pattern modification mechanism 130 that will be described below.

In other words, each of the pattern bars 110 is rotatably supported by the frame 120 by a rotational supporting part 131, for example, a bearing. In addition, each of the pattern bars 110 is connected to an actuator 132. The actuator 132 may rotate the pattern bars 110 to a desired angle. The actuator 132 may be, for example, a micro electromechanical system (MEMS). In addition, all variety of driving sources capable of rotating the pattern bars 110 may be used as the actuator 132.

When the pattern bars 110 rotate, a distance between openings defined by the pattern bars 110, e.g., a pitch, may be changed to modify the deposition pattern. In this way, a plurality of deposition patterns may be fashioned.

A plurality of the pattern bars 110 may be adjusted simultaneously. The pattern bars 110 may be adjusted simultaneously by the pattern modification mechanism 130.

The pattern bars 110 may be adjusted individually. The pattern bars may be adjusted individually by the pattern modification mechanism 130.

Figure 3A:
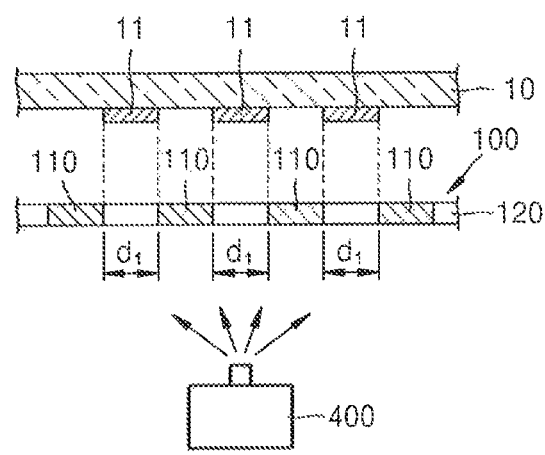
FIGS. 3A and 3B are views illustrating a process of modifying a deposition pattern of the mask of FIG. 1 according to an exemplary embodiment of the present invention.
Figure 3B:
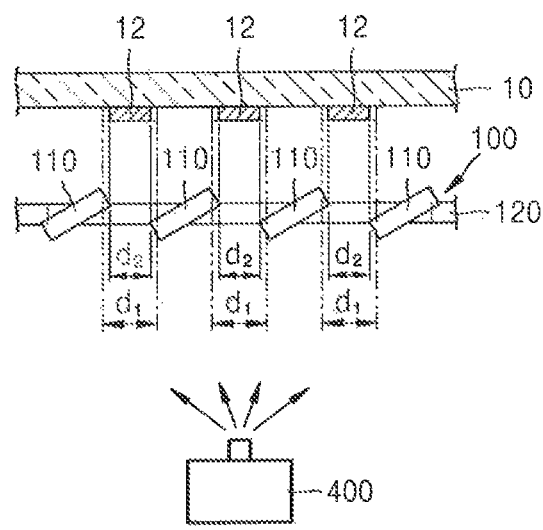

FIGS. 3A and 3B illustrate a process of modifying the deposition pattern of the mask 100 through the rotation of the pattern bars 110, according to an exemplary embodiment of the present invention. Initially, the openings between the pattern bars 100 may have a square shape. When the pattern bars 110 are rotated, a distance between the adjacent pattern bars 110 (e.g., the pitch) may be gradually changed.

FIG. 3A illustrates, for example, a state in which the pattern bars 110 are not rotated. Here, the pattern bars 110 may be maintained at a pitch d1. For example, if a deposition process is performed in this state, a thin film 11 may be formed to correspond to the deposition pattern having the pitch d1 of the mask 100 on a substrate 10.

In the state shown in FIG. 3B, the pattern modification mechanism 130 is operated to slightly rotate the pattern bars 110. For example, the pattern bars 110 are changed in pitch from the pitch d1 to the pitch d2, as shown in FIG. 3B. Then, for example, if a deposition process is performed with the pattern bars 110 maintained at the pitch d2, a thin film 12 may be formed on the substrate 10 to correspond to the deposition pattern having the pitch d2 of the mask 100.

A thin film deposition process using the mask 100 having the above-described structure will be described below. With reference to FIG. 3B, a thin film 11 may be formed on a substrate 10 by using a deposition pattern having a pitch d1. A mask 100 is disposed within a deposition chamber. Pattern bars 110 of the mask 100 are maintained at the pitch d1. A deposition source 400 may deposit the thin film 11 on the substrate 10. The thin film 11 is deposited on the substrate 10 according to the deposition pattern of the mask 100 having the pitch d1. The thin film 11 having the pitch d1 may be continuously deposited.

With regard to FIG. 3B, a thin film 12 may be formed on a substrate 10 by using a deposition pattern having a pitch d2. A pattern modification mechanism 130 may rotate the pattern bars 110 and change the pitch of the pattern bars 110 from the pitch d1 to the pitch d2. A deposition source 400 may deposit the thin film 12 on the substrate 10. The thin film 12 may be deposited on the substrate 10 according to the deposition pattern having the pitch d2. The thin film 12 having the pitch d2 may be continuously deposited. The thin film 12 may be formed on the thin film 11. When the deposition process is performed while changing the deposition pattern as described above, thin films complying with various standards may be deposited by using a single mask, for example, mask 100. Thus, the mask 100 may improve efficiency. Further, use of the mask 100 may improve productivity.

Figure 4:
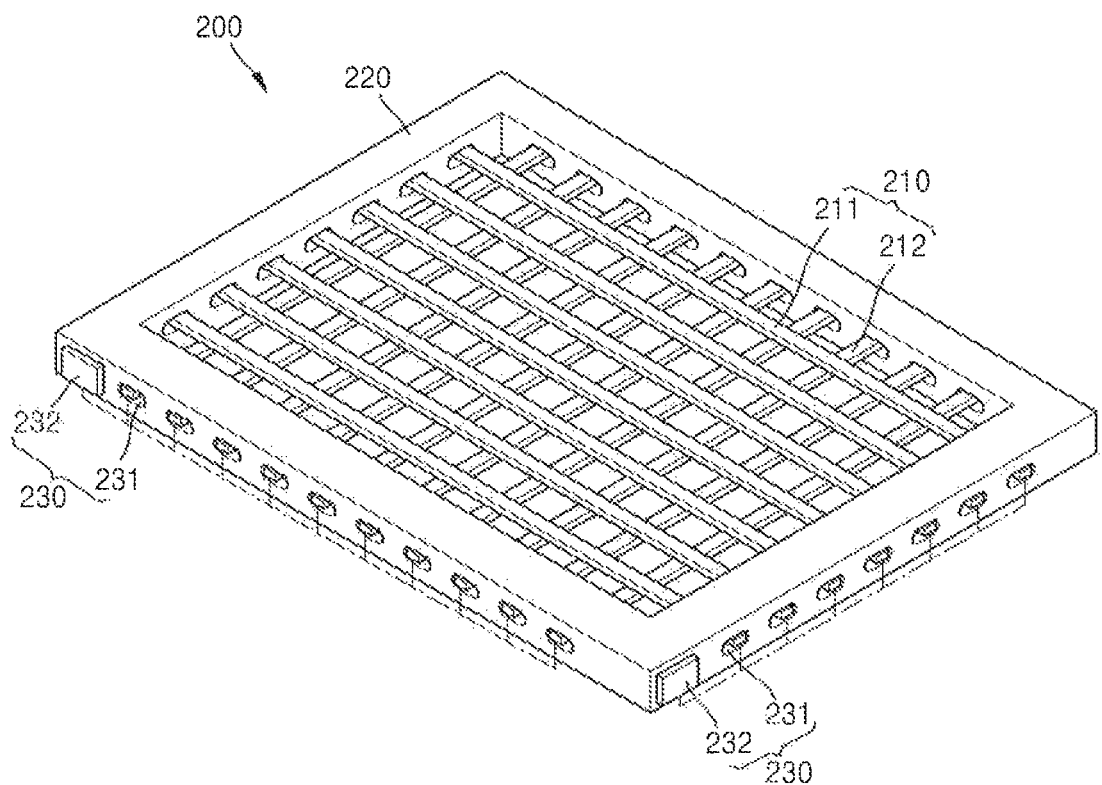
FIG. 4 is a perspective view of a mask according to an embodiment of the present invention.

FIG. 4 is a perspective view of a mask 200 according to an exemplary embodiment of the present invention. The mask 200 may include pattern bars 210. Pattern bars 210 may include first pattern bars 211 and second pattern bars 212. The first pattern bars 211 and the second pattern bars 212 may perpendicularly cross each other to form openings. The pattern bars 210 may linearly slide to change the size of the openings and thus change the deposition pattern. To accomplish this, the mask 200 may include a pattern modification mechanism 230. The pattern modification mechanism 230 may include a sliding support part 231 and an actuator 232. The sliding support part 231 may support the patterning bars 210 to the frame 220 of the mask 200, yet be large enough so that the bars can be slid therein. The sliding support part 231 and the actuator 232 may be disposed in the frame 220. The actuator 232 may slide each of the patterning bars 210 supported by the sliding support part 231 into a plurality of positions. For example, the actuator 232 may be a micro electromechanical system (MEMS). In addition, a variety of driving sources capable of moving the pattern bars 210 may be used as the actuator 232.

When the pattern bars 210 slidingly move, a distance between openings defined by the pattern bars 210, e.g. a pitch, may be changed to modify the deposition pattern.

Figure 5A:
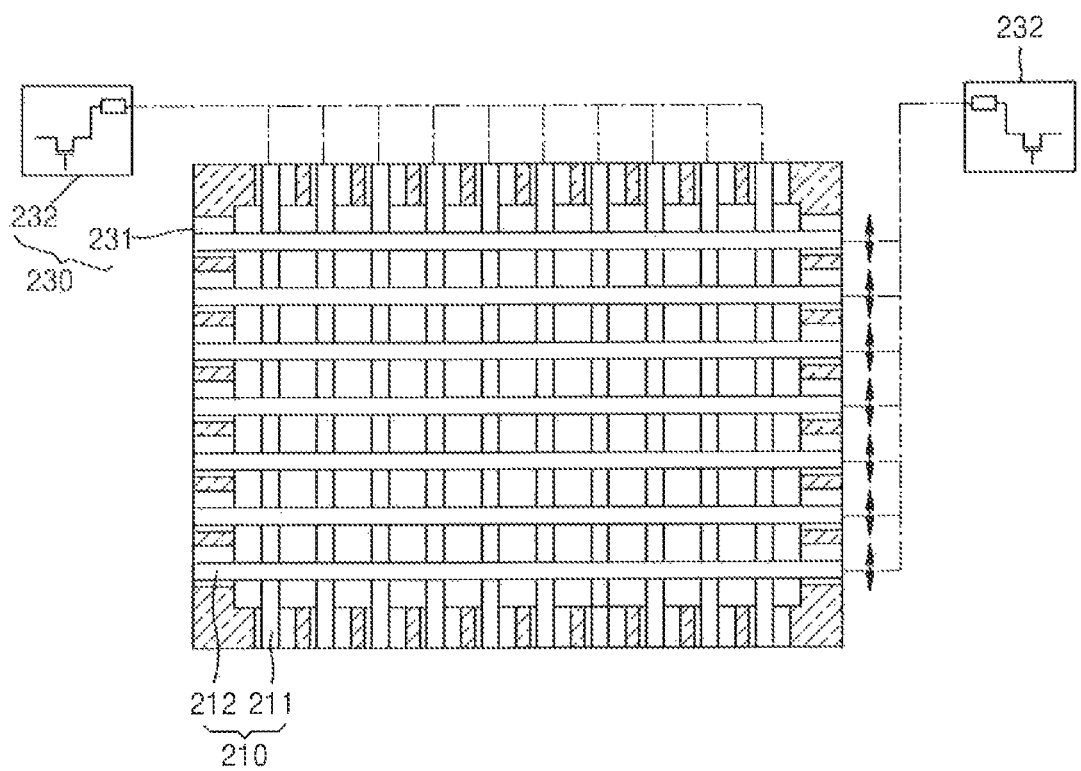
FIGS. 5A and 5B are views illustrating a process of modifying a deposition pattern of the mask of FIG. 4 according to an exemplary embodiment of the present invention.
Figure 5B:
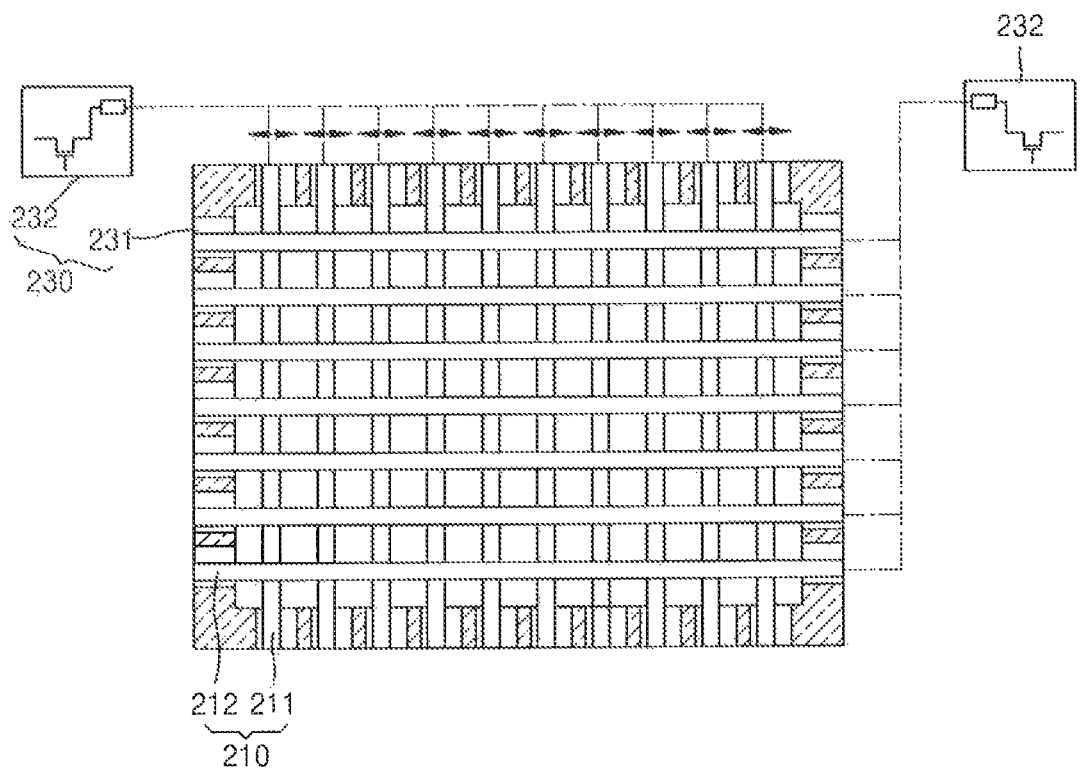

FIGS. 5A and 5B illustrate a process of modifying the deposition pattern of the mask 200 through the movement of the pattern bars 210, according to an embodiment of the present inventive concept.

FIG. 5A illustrates a process of moving the first pattern bars 211 while the pattern modification mechanism 230 operates. According to the process of FIG. 5A, a thin film may be formed to correspond to a modified deposition pattern while a pitch between the first pattern bars 211 is changed.

In addition, FIG. 5B illustrates a process of moving the second pattern bars 212 while the pattern modification mechanism 230 operates. According to the process of FIG. 5B, a thin film may be formed to correspond to a modified deposition pattern while a pitch between the second pattern bars 212 is changed.

Alternatively, the first and second pattern bars 211 and 212 may slide at the same time to modify the pattern.

A plurality of the pattern bars 210 may be adjusted simultaneously. The pattern bars 210 may be adjusted simultaneously by the pattern modification mechanism 230.

The pattern bars 210 may be adjusted individually. The pattern bars may be adjusted individually by the pattern modification mechanism 230.

A thin film deposition process using the mask 200 having the above-described structure will be described below.

For example, with reference to FIG. 5A, the mask 200 with the first pattern bars 211 adjusted in pitch may be placed in a deposition chamber. In this state, a deposition process may be performed and a thin film may be deposited corresponding to the deposition pattern of the mask 220.

With reference to FIG. 5B, the mask 200 with the second pattern bars 212 adjusted in pitch may be placed in the deposition chamber. A deposition process may be performed and a thin film may be deposited corresponding to the deposition pattern of the mask 200. The thin film may be formed on the thin film. Therefore, when a deposition process is performed while changing the deposition pattern as described above with reference to FIGS. 5A and 5B, thin films complying with various standards may be deposited by using a single mask 200. Thus, the mask 200 may improve efficiency. Further, use of the mask 200 may improve productivity.

According to an exemplary embodiment of the present invention, the masks 100 and 200 may be used for depositing various thin films in addition to a process of patterning an organic light-emitting layer.

According to an exemplary embodiment of the present invention, a mask for depositing a thin film and a method of depositing the thin film by using the same are provided. In using the mask and methods, various patterns may be formed using a single mask, and thus, products having various characteristics may be produced using one mask. Thus, the loads in the manufacture, management, and replacement of the mask may be reduced and thereby lead to improved productivity.

While the present invention has been shown and described with reference to the exemplary embodiments thereof, it will be apparent to those of ordinary skill in the art that various changes in form and detail may be made thereto without departing from the spirit and scope of the invention as defined by the claims.

What is claimed is:

1. A deposition mask, comprising
   a frame;
   pattern bars disposed on the frame, the pattern bars configured to form a deposition pattern, wherein each end of each pattern bar is coupled to a rotational support part, wherein each rotational support part is connected to one pattern bar of the pattern bars, wherein each rotational support part is configured to rotate the one pattern bar independently of all other pattern bars, and wherein each rotational support part is disposed in an internal surface of the frame facing an opening in a center of the frame; and
   wherein the pattern bars comprise first pattern bars disposed in a first direction; and second pattern bars disposed in a second direction crossing the first direction; and
   a pattern modification mechanism configured to move the pattern bars to modify the deposition pattern.

2. The mask of claim 1, wherein the pattern modification mechanism comprises:
   an actuator configured to rotate each of the pattern bars.

3. The mask of claim 2, wherein the actuator comprises a micro electromechanical system (MEMS).

4. The mask of claim 2, wherein a space between the pattern bars is square.

5. A deposition mask, comprising:
   a frame including pattern bars configured to be adjusted for a plurality of deposition patterns, wherein each end of each pattern bar is coupled to a rotational support part, wherein each rotational support part is connected to one pattern bar of the pattern bars, wherein each rotational support part is configured to move the one pattern bar independently of all other patterns bars, and wherein each rotational support part is disposed in an internal surface of the frame facing an opening in a center of the frame; and
   wherein the pattern bars comprise first pattern bars disposed in a first direction; and second pattern bars disposed in a second direction, the second direction crosses the first direction; and
   a pattern modification mechanism configured to adjust the position of the pattern bars to form the plurality of deposition patterns.

6. The deposition mask of claim 5, wherein the pattern modification mechanism comprises an actuator configured to rotate the pattern bars.

7. The deposition mask of claim 6, wherein the actuator comprises a micro electromechanical system (MEMS).

8. The deposition mask of claim 5, wherein the rotational support parts enable the pattern bars to be rotated.

9. The deposition mask of claim 5, wherein the pattern modification mechanism is configured to adjust a plurality of the pattern bars simultaneously.

10. The deposition mask of claim 5, wherein the pattern modification mechanism is configured to adjust a plurality of the pattern bars individually.

* * * * *